United States Patent
Yaegashi et al.

(10) Patent No.: US 12,360,298 B2
(45) Date of Patent: Jul. 15, 2025

(54) DIFFRACTION GRATING, METHOD FOR MANUFACTURING DIFFRACTION GRATING, AND PHOTOMASK

(71) Applicant: Hitachi High-Tech Corporation, Tokyo (JP)

(72) Inventors: Kenta Yaegashi, Tokyo (JP); Yoshisada Ebata, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 766 days.

(21) Appl. No.: 17/630,597

(22) PCT Filed: Feb. 21, 2020

(86) PCT No.: PCT/JP2020/007145
§ 371 (c)(1),
(2) Date: Jan. 27, 2022

(87) PCT Pub. No.: WO2021/038919
PCT Pub. Date: Mar. 4, 2021

(65) Prior Publication Data
US 2022/0252768 A1  Aug. 11, 2022

(30) Foreign Application Priority Data
Aug. 29, 2019  (JP) .................. 2019-157265

(51) Int. Cl.
*G02B 5/18*  (2006.01)

(52) U.S. Cl.
CPC ......... *G02B 5/1852* (2013.01); *G02B 5/1857* (2013.01); *G02B 5/1861* (2013.01)

(58) Field of Classification Search
CPC ... G02B 5/1852; G02B 5/1857; G02B 5/1861
See application file for complete search history.

(56) References Cited

U.S. PATENT DOCUMENTS

| | | | |
|---|---|---|---|
| 5,428,472 A | 6/1995 | Miyake et al. | |
| 2014/0092384 A1* | 4/2014 | Ebata | G01J 3/42 438/795 |

(Continued)

FOREIGN PATENT DOCUMENTS

| | | |
|---|---|---|
| EP | 2 752 691 A1 | 7/2014 |
| JP | H08-146209 A | 6/1996 |

(Continued)

OTHER PUBLICATIONS

T. Aono, et al. "Two-Dimensional Curving Techniques from Flat Diffraction Grating to Concave Diffraction Grating," 2019 20th International Conference on Solid-State Sensors, Actuators and Microsystems & Eurosensors XXXIII, Berlin, Germany, 2019, pp. 1728-1731, doi: 10.1109/TRANSDUCERS.2019.8808720. (Year: 2019).*

(Continued)

*Primary Examiner* — Jonathan Johnson
*Assistant Examiner* — Jayson D Cosgrove
(74) *Attorney, Agent, or Firm* — Baker Botts L.L.P.

(57) ABSTRACT

An objective of the present invention is to improve a diffraction grating. A molding member including a substrate and a resist pattern having a surface shape including grooves is prepared. The grooves include bottom portions BP1 and top portions TP1 that are alternately repeated in an X direction, and that each extend in a Y direction. The bottom portions adjacent to each other have an interval that changes stepwise. Next, a metal film is formed on a surface of the resist pattern to cover the grooves, and then the metal film is peeled off from the molding member. As a result, the metal film is formed to have a surface shape reverse to the surface shape of the resist pattern is formed. Top portions TP2 and bottom portions BP2 of the metal film correspond to bottom (Continued)

portions BP1 and top portions TP1 of the resist pattern respectively.

13 Claims, 16 Drawing Sheets

(56) References Cited

U.S. PATENT DOCUMENTS

| 2015/0355394 A1* | 12/2015 | Valera | G02B 5/1866 |
| | | | 359/571 |
| 2016/0282526 A1 | 9/2016 | Aono et al. | |
| 2020/0278481 A1 | 9/2020 | Yaegashi et al. | |

FOREIGN PATENT DOCUMENTS

| JP | H10-012512 A | 1/1998 | |
| JP | H11-271956 A | 10/1999 | |
| JP | H11-305023 A | 11/1999 | |
| JP | 2008-185730 A | 8/2008 | |
| JP | 2011-002487 A | 1/2011 | |
| WO | WO 2012/157697 A1 | 11/2012 | |
| WO | WO-2016059928 A1 * | 4/2016 | B29C 33/38 |
| WO | WO 2019/130835 A1 | 7/2019 | |

OTHER PUBLICATIONS

English machine translation of WO-2016059928-A1 (Apr. 2016) (Year: 2016).*

Aono, T., et al., Two-Dimensional Curving Techniques from Flat Diffraction Grating to Concave Diffraction Grating, Transducers 2019—Eurosensors XXXIII), IEEE, pp. 1728-1731 (2019).

Andersson, H., Single photomask, multilevel kinoforms in quartz and photoresist: manufacture and evaluation, Applied Optics, vol. 29, No. 28, pp. 4259-4267 (1990).

Extended European Search Report, mailed Sep. 11, 2023, for European Application No. 20857062.2.

International Search Report, mailed Apr. 21, 2020, for International Application No. PCT/JP2020/007145.

* cited by examiner

[FIG. 1]
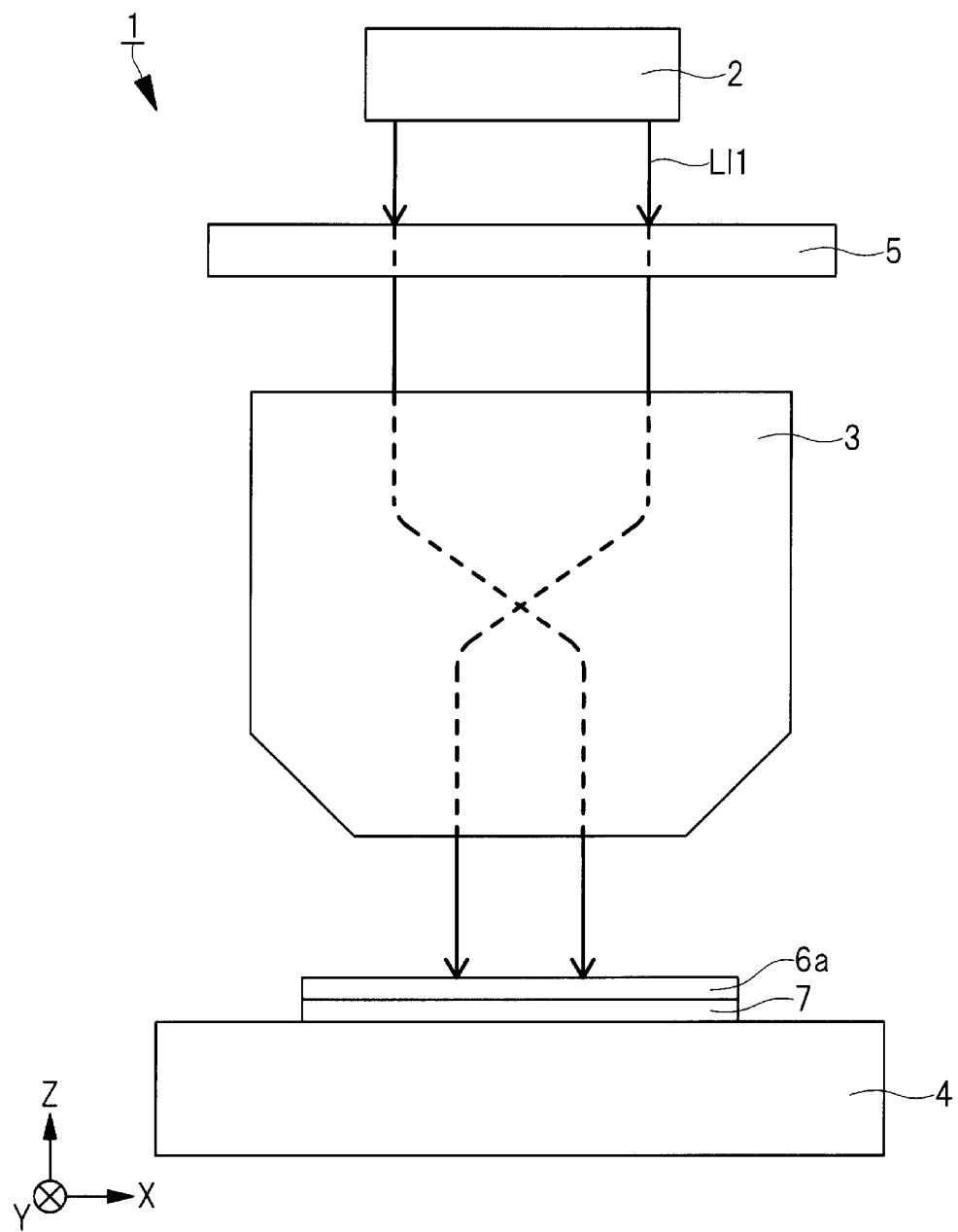

[FIG. 2]
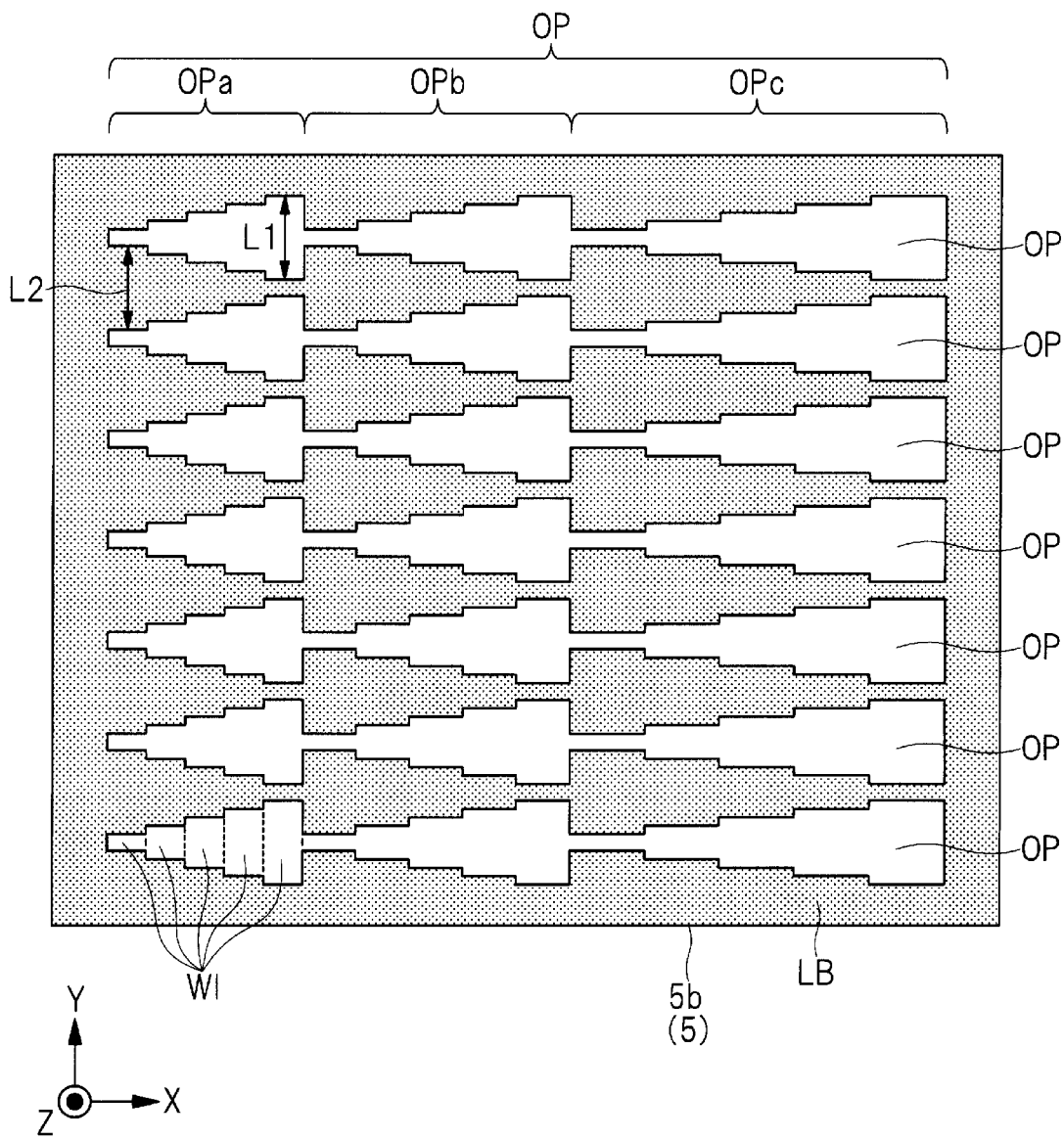

[FIG. 3]
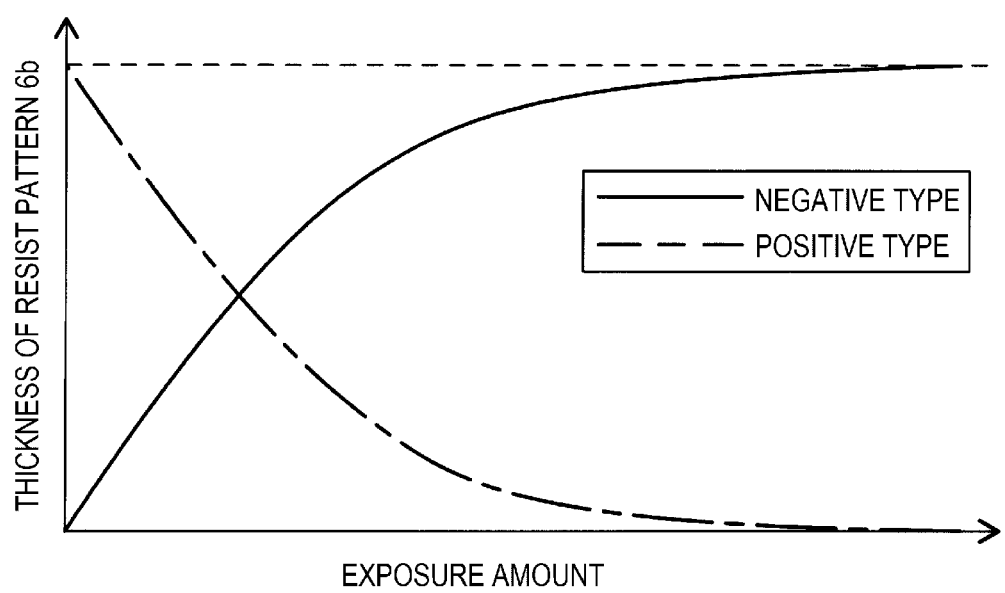

[FIG. 4A]
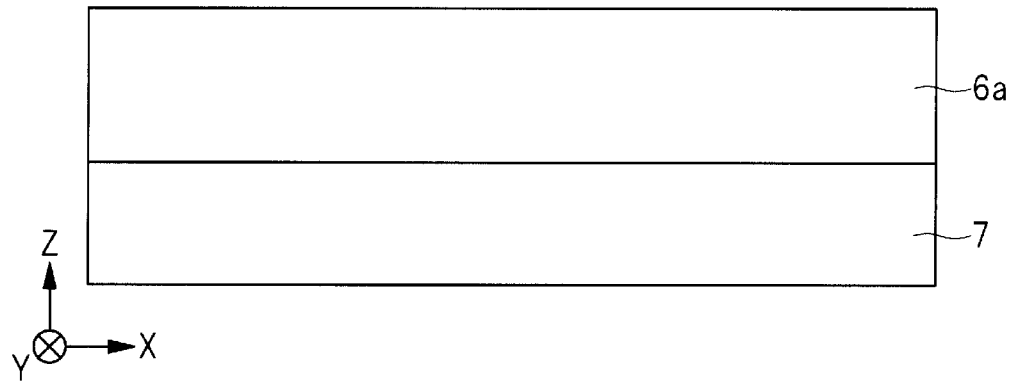
[FIG. 4B]
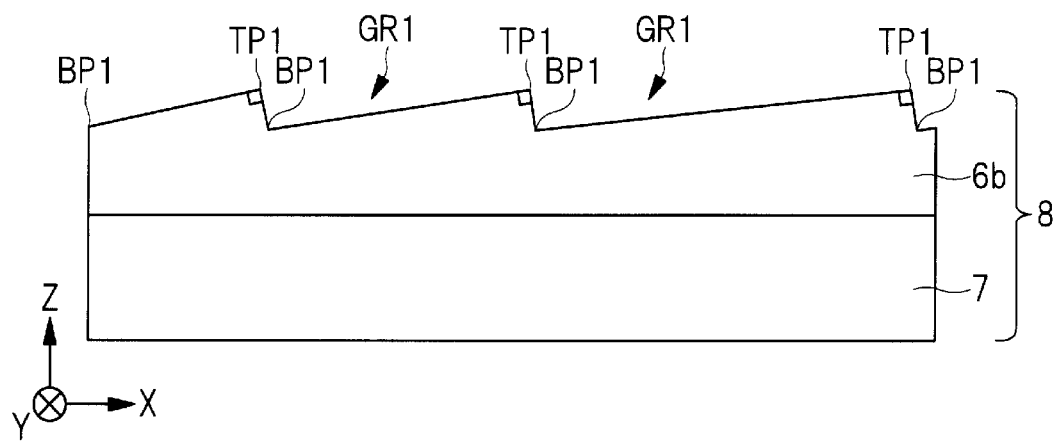
[FIG. 4C]
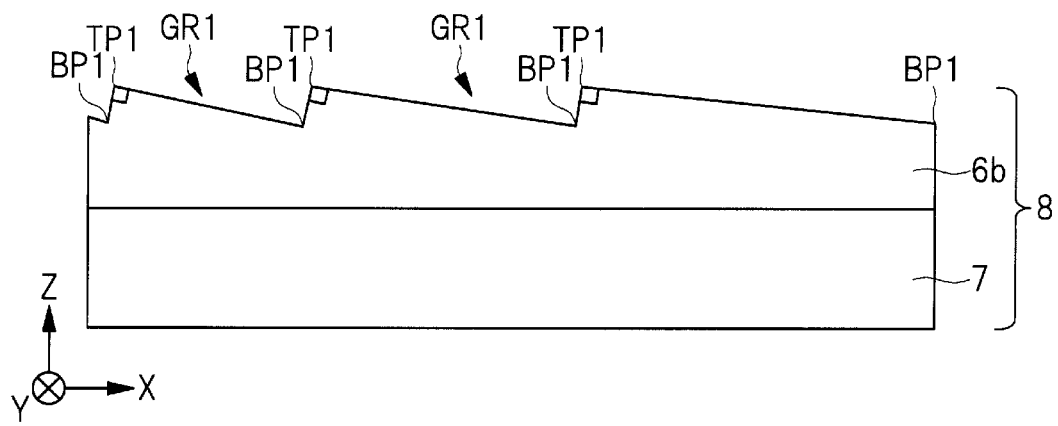

[FIG. 5]
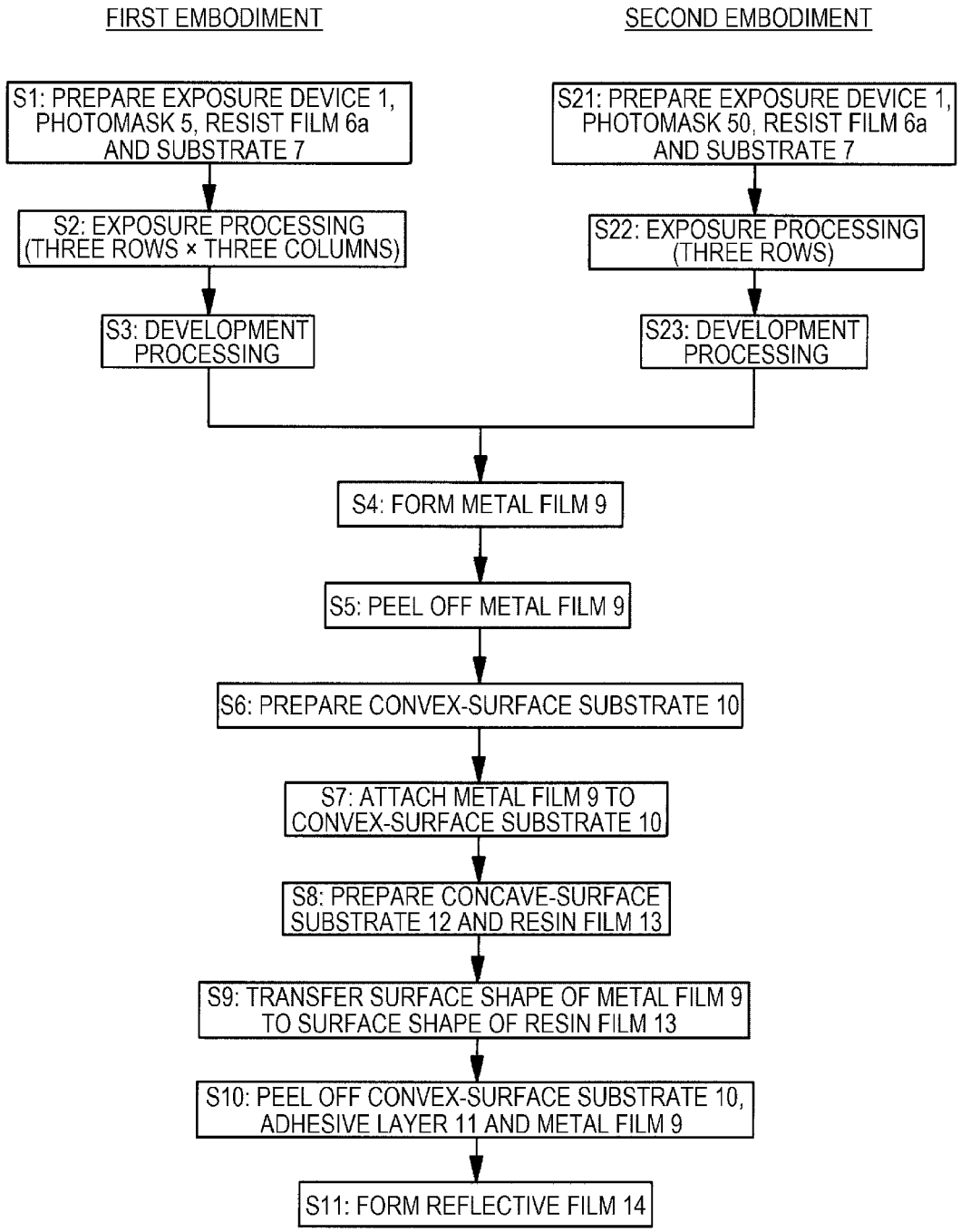

[FIG. 6]
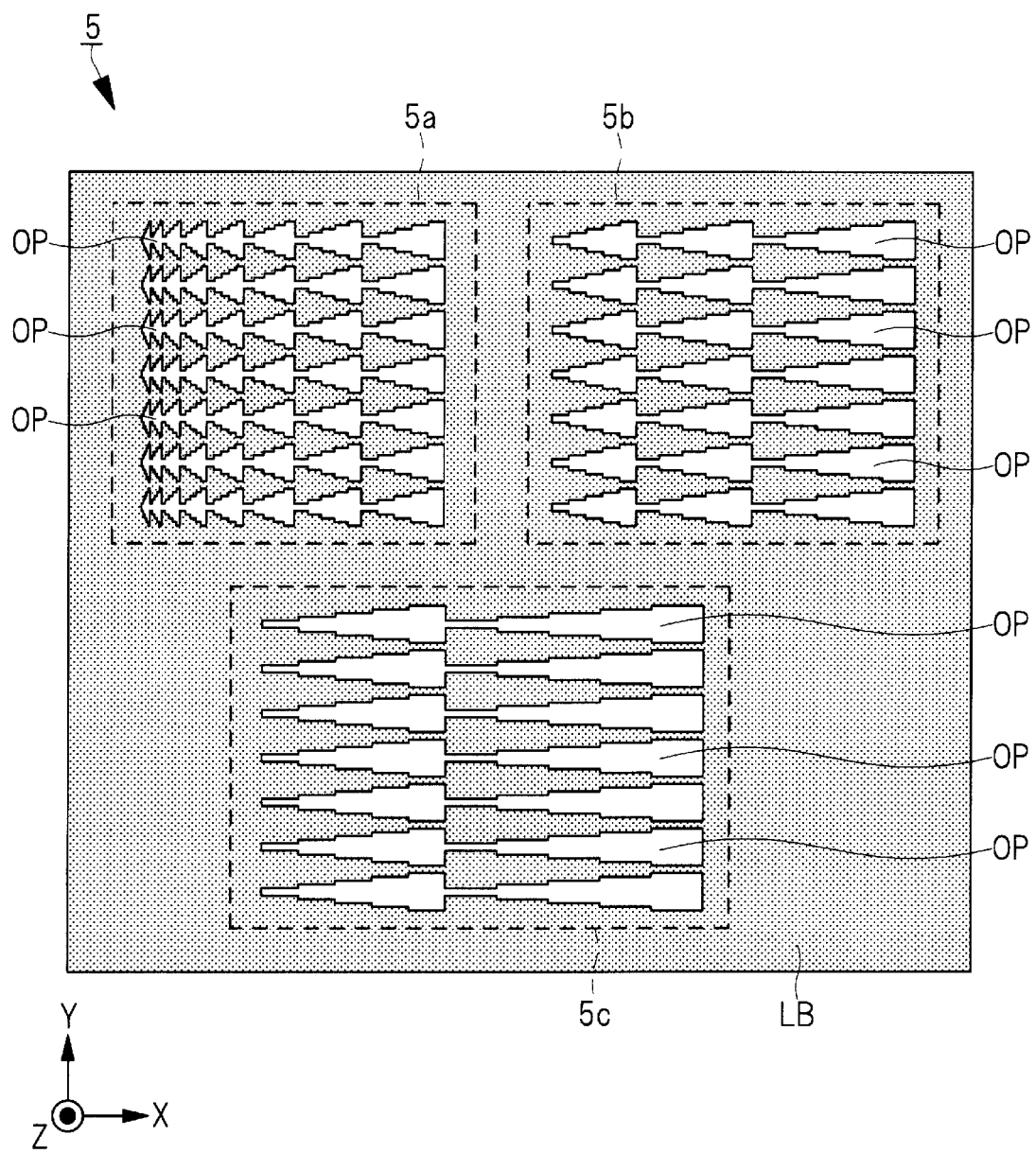

[FIG. 7]
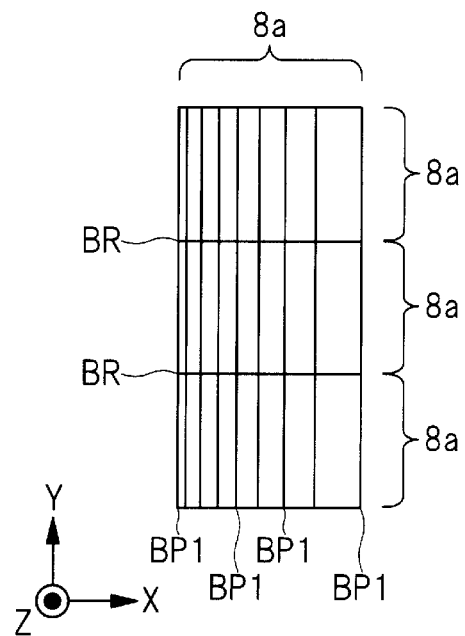
[FIG. 8]
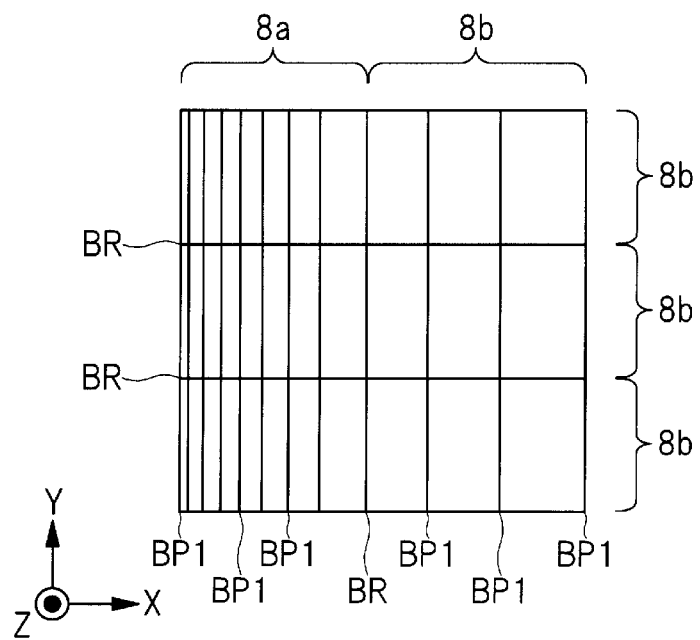

[FIG. 9]
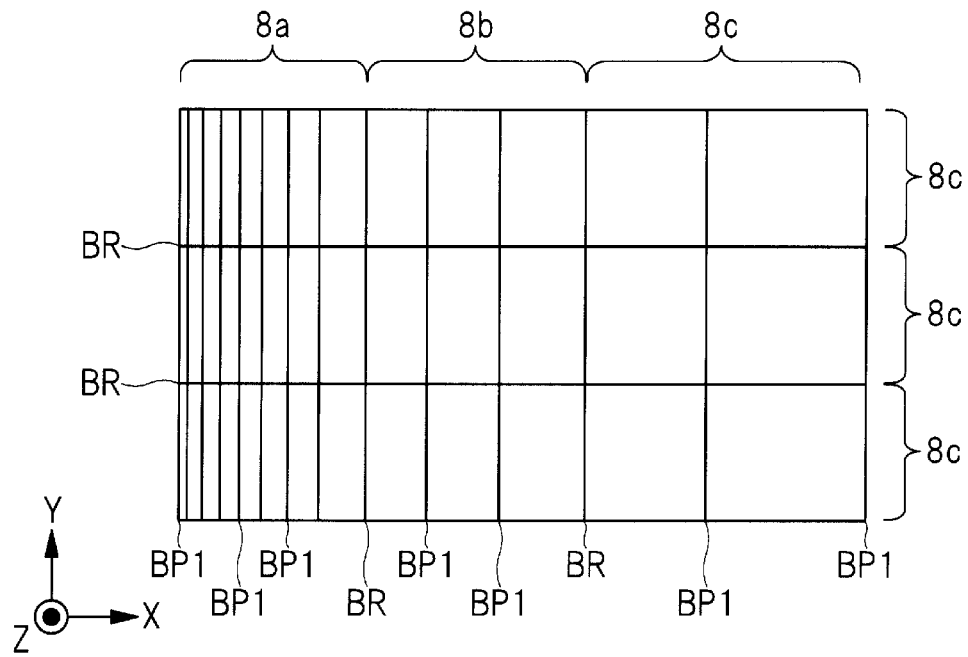
[FIG. 10]
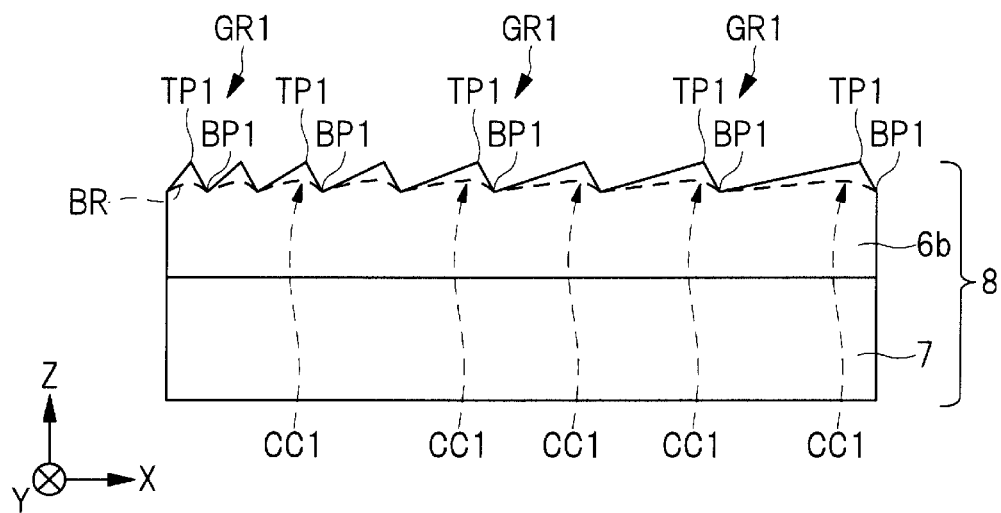

[FIG. 11]
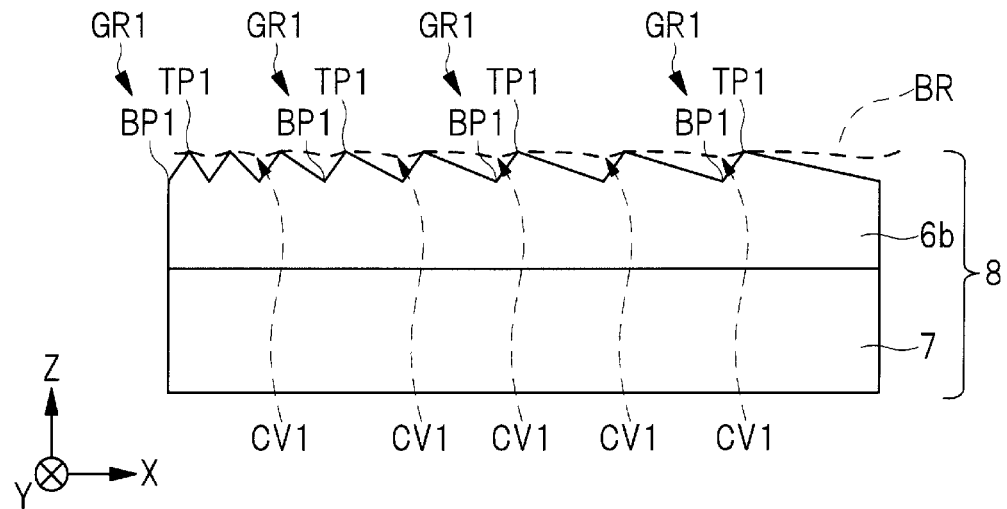
[FIG. 12]
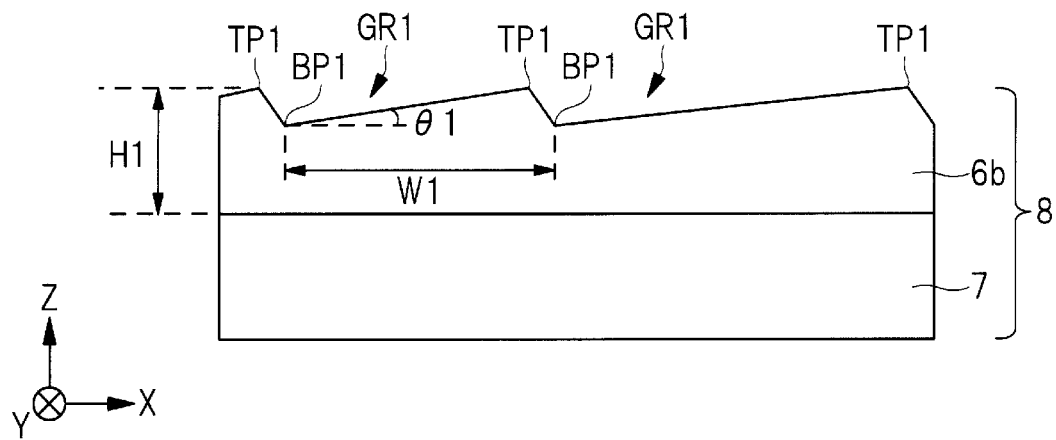

[FIG. 13]
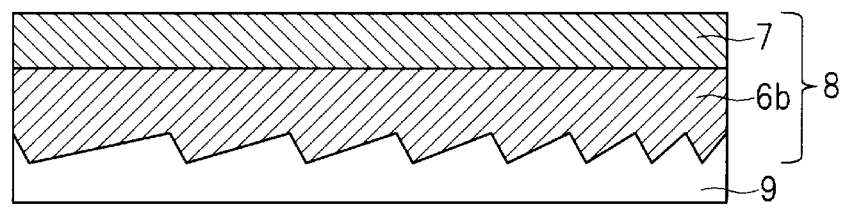
[FIG. 14]
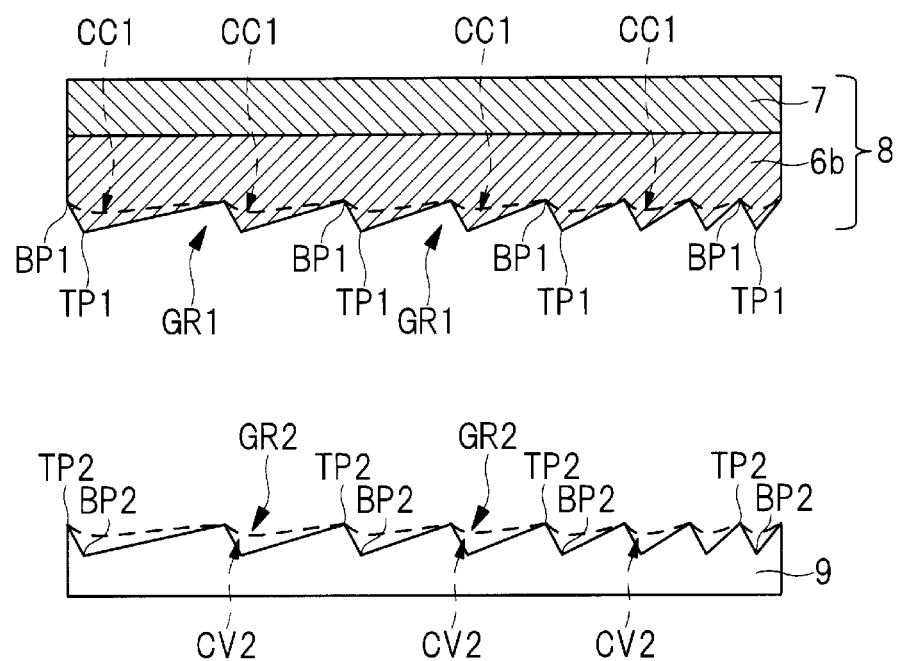
[FIG. 15]
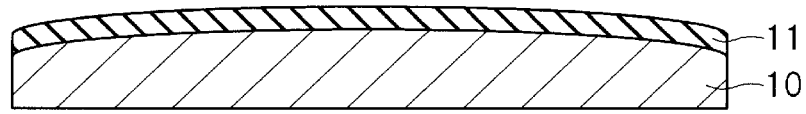

[FIG. 16]
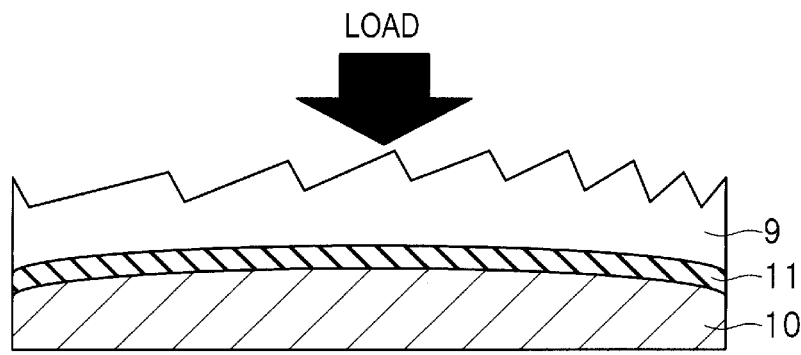
[FIG. 17]
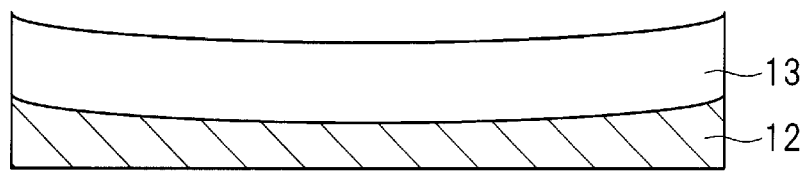
[FIG. 18]
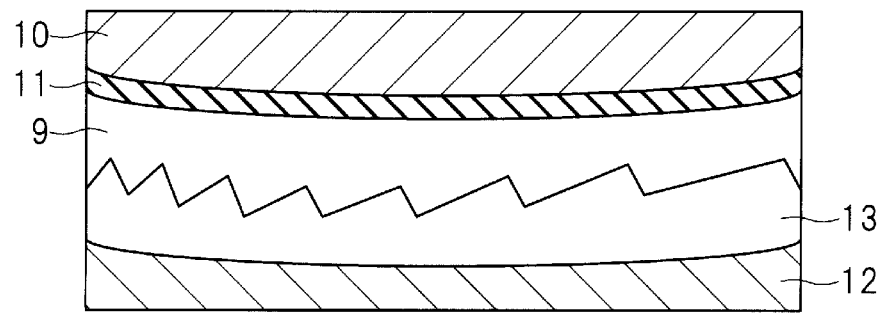

[FIG. 19]
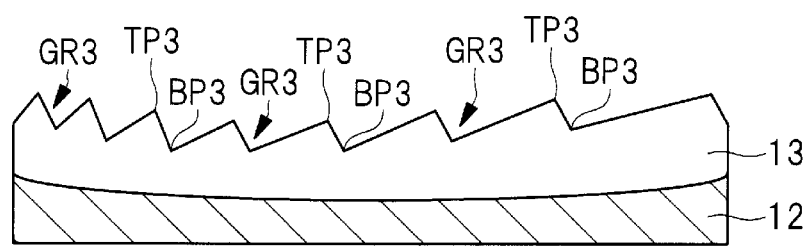
[FIG. 20]
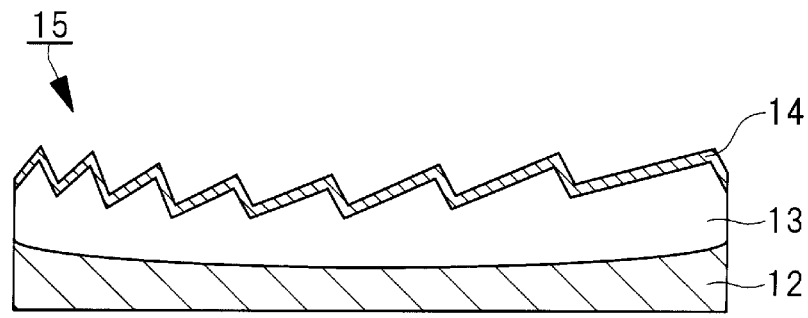

[FIG. 21]
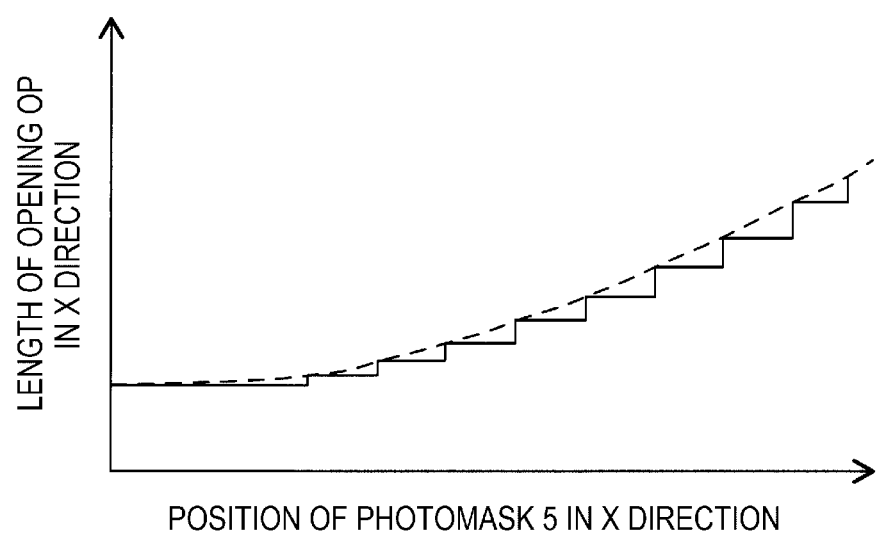

[FIG. 22]
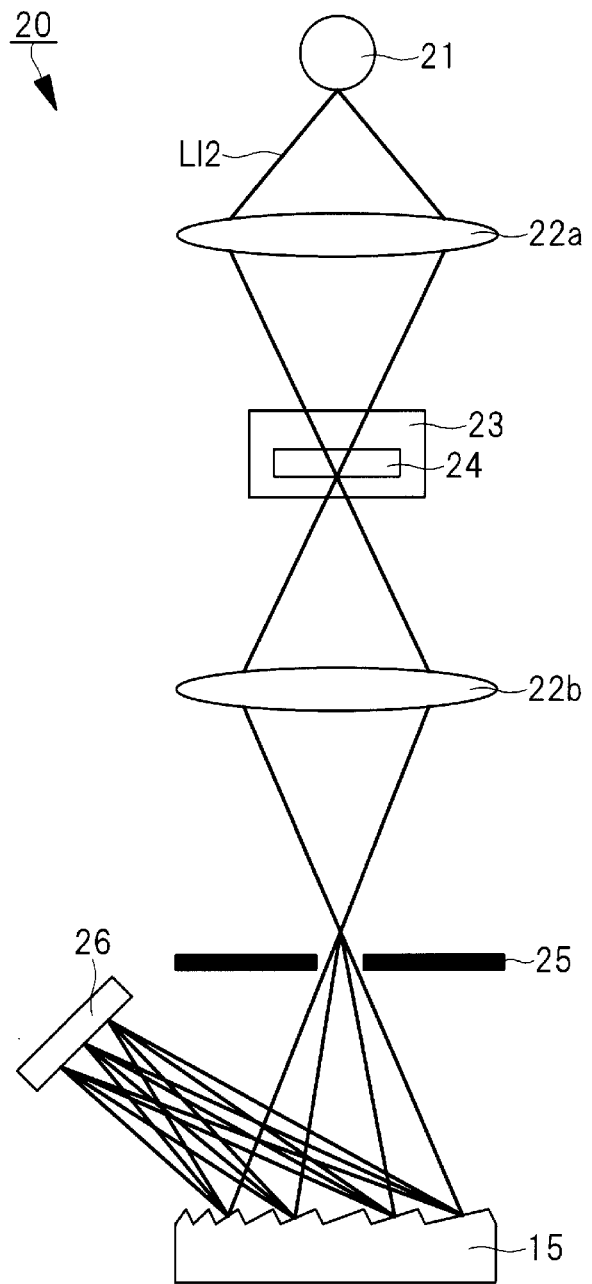

[FIG. 23]
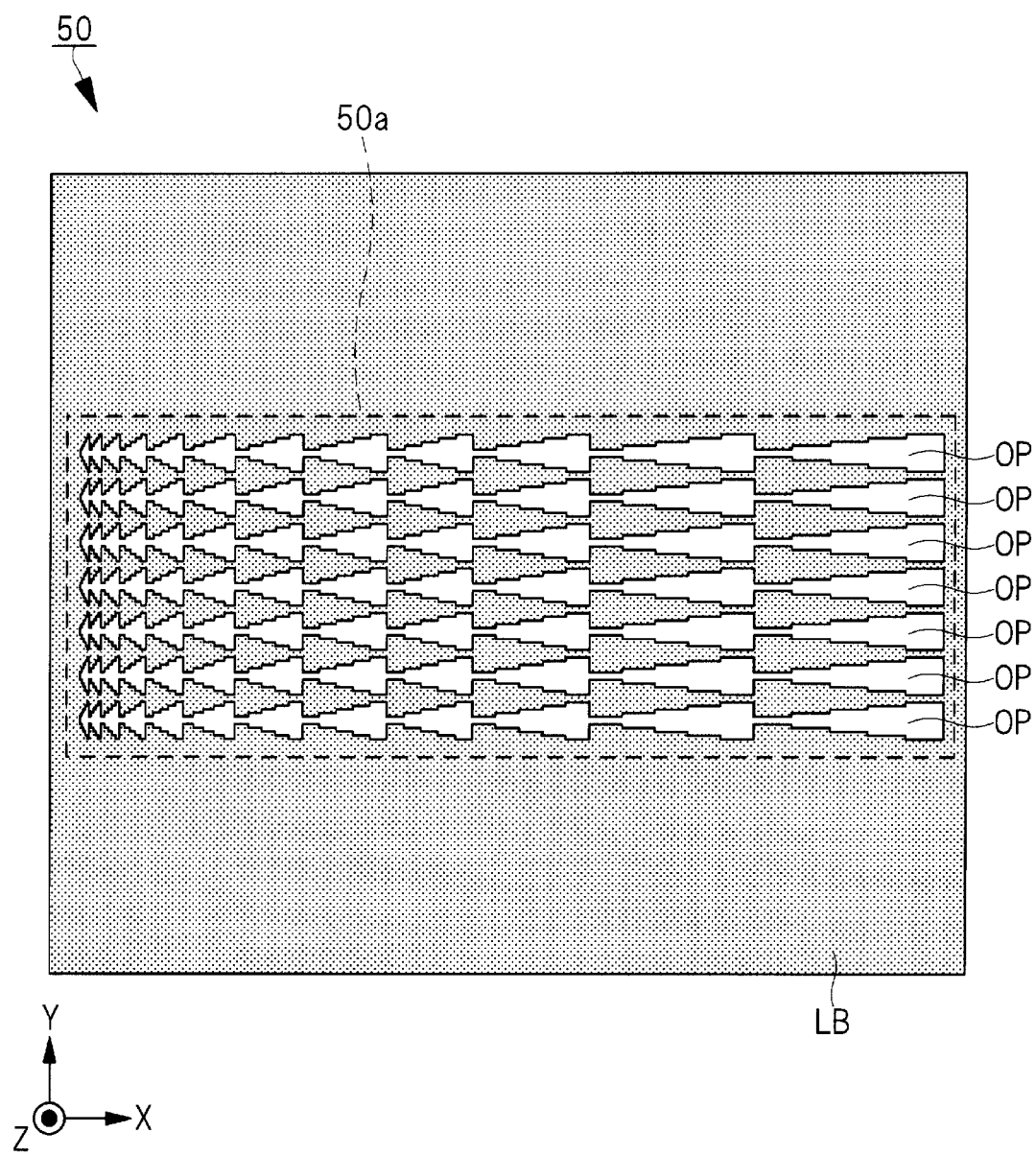

[FIG. 24]
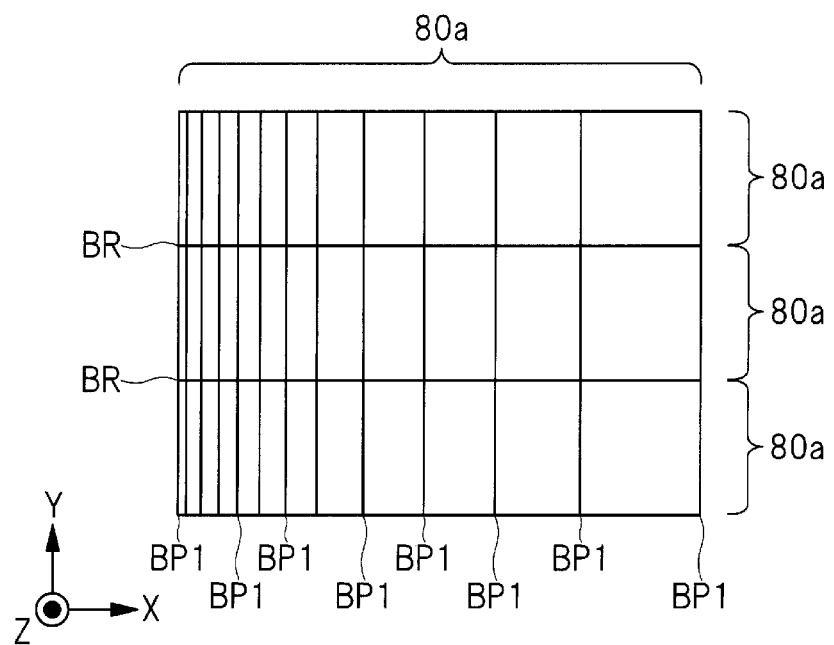

DIFFRACTION GRATING, METHOD FOR MANUFACTURING DIFFRACTION GRATING, AND PHOTOMASK

TECHNICAL FIELD

The present invention relates to a diffraction grating, a method for manufacturing a diffraction grating, and a photomask. In particular, the invention can be suitably utilized for a diffraction grating having a sawtooth shape and a photomask used to form a sawtooth shape.

BACKGROUND ART

In a spectroscope of a spectroscopic analyzer or the like, an optical element such as a diffraction grating is used in order to divide light in which various wavelengths are mixed (e.g., white light) into wavelengths of narrow bands. A surface of the diffraction grating is a surface of an optical material deposited with a reflective film, and the surface of the optical material is notched with fine grooves.

Examples for a groove shape of the diffraction grating includes various shapes such as a sine wave shape and a rectangular shape, but a blazed diffraction grating having a sawtooth shape is capable of obtaining high diffraction efficiency at a blazed wavelength, and thus is used in a spectroscope such as a spectrophotometer. The blazed wavelength is a wavelength at which the diffraction efficiency is maximized when light is incident on the diffraction grating. When regular reflection occurs between the incident light and diffracted light with respect to an inclined long side of a groove, there is a relationship of Formula 1 below between the blazed wavelength and an inclination angle $\alpha$ of the long side.

$$\sin\alpha = \lambda / (2d \cdot \cos\rho) \quad \text{[Formula 1]}$$

Here, d is a period of grooves of the diffraction grating, and an angle $\rho$ is ½ of an angle formed by the incident light, a center of the diffraction grating, and the diffracted light in the spectrophotometer.

A spectroscope of a spectroscopic analyzer generally uses a diffraction grating having a size of about 10 mm×10 mm to 50 mm×50 mm, whereas a large-sized analyzer or the like uses a diffraction grating having a size of 100 mm×100 mm or more.

In related art, when such a large-area diffraction grating is to be manufactured, a mechanically ruling method using a ruling engine or a holographic exposure method performed by two-beam interference using a laser has mainly been applied. For example, PTL 1 discloses a technique of manufacturing a blazed diffraction grating by forming a periodic pattern on a photoresist film through holographic exposure and performing oblique ion beam etching using the photoresist film as a mask.

CITATION LIST

Patent Literature

PTL 1: JP-A-11-305023

SUMMARY OF INVENTION

Technical Problem

When a large-area diffraction grating is to be ruled, one groove is formed each time by using a tool to rule the diffraction grating in the mechanically ruling method using the ruling engine. This leads to a problem of a long ruling distance and long manufacturing time.

In addition, in a manufacturing technique of the diffraction grating, the period of grooves may be required to be at unequal intervals in order to reduce an aberration generated at the time of spectroscopy and to provide a spectral action, a light-condensing action and an imaging action. The holographic exposure method, can manufacture only a diffraction grating having a sine wave shape or a shape close to a sine wave shape, and thus cannot obtain a high diffraction efficiency cannot. Even by using the technique disclosed in PTL 1, it is difficult to manufacture a diffraction grating having a period of grooves at unequal intervals.

On the other hand, a technique of manufacturing a diffraction grating using a photolithographic technique has also been developed, but has not been subjected to sufficient study to increase an area of the sawtooth shape and to obtain a period of grooves at unequal intervals.

An objective of the application is to provide a diffraction grating (optical element) having a large-area sawtooth shape and a period of grooves at unequal intervals, that is, to improve a performance of the diffraction grating. Another objective of the invention is to manufacture a diffraction grating in a short time and to prevent an increase in manufacturing cost. Still another objective of the invention is to provide a photomask for manufacturing such a diffraction grating.

Other objectives, problems, and novel features will be apparent from description of the specification of the application and the accompanying drawings.

Solution to Problem

According to one embodiment, a method for manufacturing the diffraction grating includes steps of: (a) preparing a molding member including a first substrate and a resist pattern formed on the first substrate and having a surface shape including a plurality of grooves; (b) forming a first metal film on a surface of the resist pattern to cover the plurality of grooves; (c) peeling off the first metal film from the molding member to prepare the first metal film having a surface shape reverse to the surface shape of the resist pattern; (d) preparing a second substrate having a convex surface as a surface shape; (e) forming an adhesive layer on a surface of the second substrate; (f) after the steps (a) to (e), disposing the first metal film on the surface of the second substrate such that a rear surface of the first metal film faces the surface of the second substrate; (g) after the step (f), applying a load to the first metal film from a surface side of the first metal film, thereby attaching the first metal film to the surface of the second substrate via the adhesive layer in accordance with the surface shape of the second substrate; (h) preparing a third substrate having a concave surface as a surface shape; (i) forming a resin layer on a surface of the third substrate; and (j) after the steps (g) to (i), attaching the first metal film to the resin layer such that the surface of the first metal film faces a surface of the resin layer, thereby causing a surface shape of the resin layer to be reverse with respect to the surface shape of the first metal film. Here, the plurality of grooves include a plurality of first bottom portions and a plurality of first top portions. The plurality of first bottom portions and the plurality of first top portions are alternately repeated in a first direction when viewed from a top, and each extend in a second direction orthogonal to the first direction. The first bottom portions adjacent to each other in the first direction have an interval that changes stepwise.

According to one embodiment, a diffraction grating includes: a substrate having a concave surface as a surface shape; a resin layer formed on a surface of the substrate; and a reflective film formed on a surface of the resin layer in accordance with a surface shape of the resin layer and made of a metal material. Here, the surface shape of the resin layer includes a plurality of grooves including a plurality of first bottom portions and a plurality of first top portions. The plurality of first bottom portions and the plurality of first top portions are alternately repeated in a first direction when viewed from a top, and each extend in a second direction orthogonal to the first direction. The first bottom portions adjacent to each other in the first direction have an interval changing continuously. A boundary region in which a deviation between patterns or a dimensional deviation is locally generated is present in the middle of each of the plurality of first top portions extending in the second direction. The boundary region is not present at a central position of the resin layer when viewed from a top.

According to one embodiment, a photomask includes a light-shielding film formed with a first opening. Here, the first opening includes a first portion and a second portion coupled to and communicating with the first portion in a first direction when viewed from a top. The first portion and the second portion each have a length in a second direction orthogonal to the first direction that increases stepwise in a direction from the first portion toward the second portion in the first direction. The second portion has a length longer than a length of the first portion in the first direction. The second portion has an opening area larger than an opening area of the first portion.

Advantageous Effect

According to one embodiment, performance of the diffraction grating can be improved. An increase in manufacturing cost of the diffraction grating can be prevented. A photomask for manufacturing such a diffraction grating can also be provided.

BRIEF DESCRIPTION OF DRAWINGS

FIG. 1 is a schematic diagram showing an exposure device according to a first embodiment.

FIG. 2 is a plan view showing a mask pattern as part of a photomask according to the first embodiment.

FIG. 3 is a graph showing a relationship between an exposure amount with respect to a resist film and a thickness of a resist pattern.

FIG. 4A is a cross-sectional view showing the resist film before development processing according to the first embodiment.

FIG. 4B is a cross-sectional view showing the resist pattern after the development processing according to the first embodiment.

FIG. 4C is a cross-sectional view showing the resist pattern after the development processing according to the first embodiment.

FIG. 5 is a process flow showing manufacturing steps of a molding member and a diffraction grating according to the first embodiment.

FIG. 6 is a plan view showing the photomask according to the first embodiment.

FIG. 7 is a plan view showing a manufacturing step of the molding member according to the first embodiment.

FIG. 8 is a plan view showing a manufacturing step subsequent to FIG. 7.

FIG. 9 is a plan view showing a manufacturing step subsequent to FIG. 8.

FIG. 10 is a cross-sectional view showing the molding member according to the first embodiment.

FIG. 11 is a cross-sectional view showing the molding member according to the first embodiment.

FIG. 12 is a cross-sectional view showing a dimension of the molding member according to the first embodiment.

FIG. 13 is a cross-sectional view showing a manufacturing step of the diffraction grating according to the first embodiment.

FIG. 14 is a cross-sectional view showing a manufacturing step subsequent to FIG. 13.

FIG. 15 is a cross-sectional view showing a manufacturing step subsequent to FIG. 14.

FIG. 16 is a cross-sectional view showing a manufacturing step subsequent to FIG. 15.

FIG. 17 is a cross-sectional view showing a manufacturing step subsequent to FIG. 16.

FIG. 18 is a cross-sectional view showing a manufacturing step subsequent to FIG. 17.

FIG. 19 is a cross-sectional view showing a manufacturing step subsequent to FIG. 18.

FIG. 20 is a cross-sectional view showing a manufacturing step subsequent to FIG. 19.

FIG. 21 is a graph showing a relationship between a length of an opening provided in the photomask and a position of the photomask.

FIG. 22 is a schematic diagram showing a spectroscopic analyzer equipped with the diffraction grating according to the first embodiment.

FIG. 23 is a plan view showing a photomask according to a second embodiment.

FIG. 24 is a plan view showing a manufacturing step of a molding member according to the second embodiment.

DESCRIPTION OF EMBODIMENTS

Hereinafter, embodiments will be described in detail according to the accompanying drawings. In all the drawings for describing the embodiments, members having the same functions are denoted by the same reference numerals, and repeated descriptions thereof will be omitted. In the following embodiments, description of the same or similar portion will not be repeated in principle unless necessary.

In the drawings used in the embodiments, a hatching may be omitted even in a cross-sectional view and may be added even in a plan view for easy viewing of the drawings.

An X direction and a Y direction described in the application are orthogonal to each other, and a plane including the X direction and the Y direction is a horizontal plane. A Z direction is a vertical direction orthogonal to the X direction and the Y direction and perpendicular to the horizontal plane. In the application, the Z direction may be described as a thickness direction or a height direction of a certain structure.

First Embodiment

Hereinafter, a diffraction grating and a method for manufacturing the diffraction grating according to the first embodiment will be described, but before that, a molding member used to manufacture the diffraction grating and a photomask used to manufacture the molding member will be described.

<Structure of Exposure Device 1>

The exposure device 1 according to the first embodiment will be described below with reference to FIG. 1. As shown in FIG. 1, the exposure device 1 includes a light source 2, a stage 4, and a projection optical mechanism 3 provided between the light source 2 and the stage 4. During exposure processing, a photomask (reticle) 5 is inserted between the light source 2 and the projection optical mechanism 3, and a laminated body including a substrate (semiconductor substrate) 7 made of, for example, silicon and a resist film 6a formed on the substrate 7 is mounted on the stage 4.

The light source 2 uses, for example, a g-line or an i-line of a mercury lamp, or an excimer laser such as KrF or ArF. The substrate 7 is made of, for example, silicon, and has a diameter of, for example, 8 inches ($\varphi$ 200 mm).

In the exposure device 1, the photomask 5 is irradiated with light LI1 from the light source 2, and the exposure processing is performed in which light transmitting through mask patterns provided in the photomask 5 is transferred to the resist film 6a via the projection optical mechanism 3.

Examples of an exposure method include a step-and-scan method of synchronously moving and scanning the photomask 5, the resist film 6a, and the substrate 7, and a step-and-repeat method of collectively exposing the mask patterns as part of the photomask 5 in a state in which the photomask 5, the resist film 6a, and the substrate 7 are motionless, and sequentially moving the resist film 6a and the substrate 7 in steps. Here, a case where the step-and-repeat method is used will be described. That is, the stage 4 is movable in the Y direction or the X direction, and predetermined patterns are transferred to an entire surface of the resist film 6a at maximum by moving the stage 4 to a predetermined location and repeating the exposure processing.

After the exposure processing, development processing is performed on the resist film 6a, and part of the resist film 6a is processed to form a resist pattern.

<Structure of Mask Pattern 5b>

FIG. 2 is a plan view showing the mask pattern 5b as part of the photomask 5 according to the first embodiment. As shown in FIG. 6 to be described later, a plurality of mask patterns 5a to 5c are provided in the photomask 5 according to the first embodiment, and the mask pattern 5b will be described here as a representative.

The photomask 5 (mask pattern 5b) includes a transparent substrate having transparency such as glass or synthetic quartz, and a light-shielding film LB formed on the transparent substrate. The light-shielding film LB has a function of shielding light having a certain wavelength such as visible light, and is made of, for example, chromium.

As shown in FIG. 2, the light-shielding film LB is formed with a plurality of openings OP penetrating the light-shielding film LB. The openings OP in the mask pattern 5b each include a first portion OPa to a third portion OPc coupled to and communicating with each other in the X direction. In the X direction, the first portion OPa and the second portion OPb are coupled to and communicate with each other, and the second portion OPb and the third portion OPc are coupled to and communicate with each other.

The first portion OPa to the third portion OPc each have a length in the Y direction that is not constant and varies depending on a location thereof. The first portion OPa to the third portion OPc each have a length in the Y direction that increases stepwise in a direction from the first portion OPa toward the second portion OPb (the third portion OPc) in the X direction. In the X direction, the third portion OPc has a length longer than a length of the second portion OPb, and the second portion OPb has a length longer than a length of the first portion OPa. Therefore, the third portion OPc has an opening area larger than an opening area of the second portion OPb, and the second portion OPb has an opening area larger than an opening area of the first portion OPa.

In other words, the first portion OPa includes a plurality of windows WI that each have a quadrangular planar shape, and that are coupled to and communicate with each other. In addition, the windows WI have opening areas that increase stepwise in the direction from the first portion OPa toward the second portion OPb. The second portion OPb and the third portion OPc also have windows WI having opening areas that increase stepwise except that the windows WI each have a length in the X direction longer than that in the first portion OPa.

A distance L1 which is the longest among lengths of the openings OP in the Y direction is substantially the same as a distance L2 between the openings OP adjacent to each other. In the first embodiment, the distance L1 and the distance L2 are set to be equal to or less than a resolution limit of the exposure device 1 as shown in FIG. 1. Therefore, a light quantity of light transmitting through the photomask is limited, and a transmittance changes stepwise in proportion to an aperture ratio at each location. That is, a thickness of the resist pattern after the development processing continuously changes since an exposure amount with respect to the resist film 6a continuously changes at each location.

<Partial Structure of Molding Member 8 (Resist Pattern 6b) and Method for Manufacturing the Same>

FIG. 3 shows a general relationship between the exposure amount with respect to the resist film 6a and a thickness of the resist pattern 6b after the development processing. A dashed line in a graph shows a thickness of the resist film 6a immediately after the resist film 6a is applied onto the substrate 7.

The resist film 6a used in a photolithography technique is a composition whose solubility can be changed by light, electron beams, or the like, and is generally divided into a negative type and a positive type depending on a reaction method with light or electron beams. Since a negative resist film 6a exhibits decreased solubility in a developing solution when exposed, an exposed portion remains as the resist pattern 6b after the development processing. On the other hand, since a positive resist film 6a exhibits increased solubility in a developing solution when exposed, an exposed portion is removed after the development processing.

Therefore, as shown in FIG. 3, when an exposure amount of the negative resist film 6a (solid line) increases, the thickness of the resist pattern 6b increases, and when an exposure amount of the positive resist film 6a (one-dot chain line) increases, the thickness of the resist pattern 6b decreases.

Hereinafter, a case where the exposure processing and the development processing are performed on the resist film 6a described in FIG. 3 via the photomask 5 described in FIG. 2 will be described.

FIG. 4A shows a state immediately after the negative or positive resist film 6a shown in FIG. 3 is applied onto the substrate 7. FIG. 4B shows a state of the resist pattern 6b after the development processing, and shows a case when the resist film 6a is a negative type. FIG. 4C shows a state of the resist pattern 6b after the development processing, and shows a case when the resist film 6a is a positive type.

The molding member 8 includes the substrate 7 and the resist pattern 6b after the development processing according to the first embodiment. As will be described in detail later, the molding member 8 is a member for forming a surface shape of a resin layer 13 as a main structure of a diffraction grating 15.

A surface shape of the resist pattern 6b includes a plurality of grooves GR1 and has a sawtooth shape. The plurality of grooves GR1 include a plurality of bottom portions BP1 and a plurality of top portions TP1. The plurality of bottom portions BP1 and the plurality of top portions TP1 are alternately repeated in the X direction, and each extend in the Y direction.

In the photomask 5, since the first portion OPa to the third portion OPc each have a length in the Y direction that increases stepwise, the thickness of the resist pattern 6b is not uniform, and the surface shape of the resist pattern 6b is a shape in which inclined surfaces having a long distance and a small inclination angle and inclined surfaces having a short distance and a large inclination angle are repeated alternately. In other words, a distance between one of two bottom portions BP1 adjacent to each other in the X direction and a top portion TP1 located between the two bottom portions BP1 is longer than a distance between the other of the two bottom portions BP1 and the top portion TP1.

The grooves GR1 have a period that is different at each location and increases stepwise. In other words, the bottom portions BP1 adjacent to each other in the X direction have an interval that changes stepwise and increases stepwise.

A magnification during exposure can be adjusted by the projection optical mechanism 3 shown in FIG. 1. For example, when the magnification during exposure is equal, the first portion OPa to the third portion OPc each have a length in the X direction equal to the period of the grooves GR1. In addition, as long as the magnification can be selected by the exposure device 1, the magnification during exposure may not be equal, and the mask pattern 5b may be exposed while being reduced by using, for example, a reduction exposure method. In this case, in order to obtain desired optical properties, the period of the grooves GR1 at unequal intervals may be obtained in advance by calculation, and is multiplied by a reducing magnification to obtain the length of each of the first portion OPa to the third portion OPc in the X direction, so as to be used for design of the photomask 5.

FIG. 5 shows an overall process flow of the molding member 8 and the diffraction grating 15 according to the first embodiment. Hereinafter, a method for manufacturing the molding member 8 and the diffraction grating 15 will be described with reference to FIGS. 6 to 20 while referring to steps S1 to S11 as shown in FIG. 5.

<Method for Manufacturing Molding Member 8>

Hereinafter, the molding member 8 and a method for manufacturing the same will be described with reference to FIGS. 6 to 12. Since part of structures such as shapes of the mask pattern 5b of the photomask 5 and the resist pattern 6b and methods for manufacturing the same have been described above, detailed description will not be repeated here.

<<Step S1>>

First, the exposure device 1 shown in FIG. 1 is prepared, and the laminated body including the substrate 7 and the resist film 6a is mounted on the stage 4. After the resist film 6a is applied onto the substrate 7, it is preferable to perform pre-bake processing at, for example, 50° C. to 100° C.

FIG. 6 is a plan view showing the photomask 5 inserted between the light source 2 and the projection optical mechanism 3. The photomask 5 is provided with the mask pattern 5a and the mask pattern 5c in addition to the mask pattern 5b described with reference to FIG. 2. The mask pattern 5a and the mask pattern 5c have the same configuration as the mask pattern 5b except that shapes of openings OP are different from that of the mask pattern 5b.

The openings OP of both the mask pattern 5a and the mask pattern 5c also include a plurality of portions, which each include a plurality of windows, for the same purpose as that of the first portion OPa to the third portion OPc in the mask pattern 5b. The portions of the mask pattern 5a each have a length in the X direction shorter than that of the first portion OPa to the third portion OPc, while the portions of the mask pattern 5c each have a length in the X direction longer than that of the first portion OPa to the third portion OPc.

<<Step S2>>

In the first embodiment, the exposure processing is performed multiple times in an odd number of rows×an odd number of columns such as three rows×three columns.

First, the exposure processing is performed on the resist film 6a using the mask pattern 5a as shown in FIG. 7. The resist film 6a is partially exposed in an exposure region 8a by performing exposure processing once. Next, the resist film 6a (stage 4) is moved in the Y direction and sequentially exposed in other exposure regions 8a. Here, a case where the exposure processing is performed three times in total is illustrated. These plurality of exposure regions 8a are adjacent to each other in the Y direction so as to be joined with each other.

When the plurality of exposure regions 8a are joined via such multiple times of exposure processing, the number of times of exposure processing is preferably an odd number of three or more. A reason for this is related to boundary regions BR, which will be described later.

The boundary regions BR correspond to joints of the plurality of exposure regions 8a, and are shown by solid lines extending in the X direction in the drawing. In order to facilitate understanding of the drawing, portions to become the bottom portions BP1 of the grooves GR1 after the development processing are shown by solid lines extending in the Y direction. The same applies to FIGS. 8 and 9 to be described later.

Next, as shown in FIG. 8, the exposure processing is performed on the resist film 6a using the mask pattern 5b to expose exposure regions 8b different from the exposure regions 8a. The exposure regions 8b are partial regions of the resist film 6a and are adjacent to the exposure regions 8a in the X direction. Here, positions of the mask pattern 5a and the mask pattern 5b are adjusted such that the openings OP of the mask pattern 5a and the openings OP of the mask pattern 5b are coupled to and communicate with each other in the X direction. Here, a boundary region BR is also present at a boundary between the exposure regions 8a and the exposure regions 8b due to alignment accuracy of the exposure device or the like.

Next, as shown in FIG. 9, the exposure processing is performed on the resist film 6a using the mask pattern 5c to expose exposure regions 8c different from the exposure regions 8a and the exposure regions 8b. The exposure regions 8c are partial regions of the resist film 6a and are adjacent to the exposure regions 8b in the X direction. Here, positions of the mask pattern 5b and the mask pattern 5c are adjusted such that the openings OP of the mask pattern 5b and the openings OP of the mask pattern 5c are coupled to and communicate with each other in the X direction. Similarly, a boundary region BR is also present at a boundary between the exposure regions 8b and the exposure regions 8c due to the alignment accuracy of the exposure device or the like.

<<Step S3>>

After the exposure processing in FIGS. 7 to 9 is completed, the development processing is performed on the resist film 6a. As a result, the resist pattern 6b shown in FIG. 10 or 11 is formed. After that, post-bake is performed on the resist pattern 6b at, for example, 150° C. to 200° C. The resist pattern 6b shown in FIG. 10 or 11 is obtained when the resist film 6a is a negative type or a positive type, respectively.

The surface shape of the resist pattern 6b includes the plurality of grooves GR1 having a sawtooth shape. The plurality of grooves GR1 include the plurality of bottom portions BP1 and the plurality of top portions TP1. The plurality of bottom portions BP1 and the plurality of top portions TP1 are alternately repeated in the X direction, and each extend in the Y direction. The surface shape of the resist pattern 6b is a shape in which the inclined surfaces having a long distance and a small inclination angle and the inclined surfaces having a short distance and a large inclination angle are repeated alternately. In other words, the distance between one of two bottom portions BP1 adjacent to each other in the X direction and the top portion TP1 located between the two bottom portions BP1 is longer than the distance between the other of the two bottom portions BP1 and the top portion TP1. In addition, the period of the grooves GR1 is different at each location and increases stepwise. In other words, the interval between the bottom portions BP1 adjacent to each other in the X direction changes stepwise and increases stepwise.

FIG. 12 shows an example of a dimension of the molding member 8 according to the first embodiment. Here, a case when the resist film 6a is a negative type is illustrated. A period W1 of the grooves GR1, that is, the interval between the bottom portions BP1 adjacent to each other in the X direction is, for example, within a range of 1.60 μm to 1.70 μm. A thickness H1 of the resist pattern 6b, that is, a height from a surface of the substrate 7 to the top portion TP1 is, for example, within a range of 0.10 μm to 0.20 μm. An inclination angle (blaze angle) 81 of the inclined surfaces having a long distance of the groove GR1 is 5 degrees to 7 degrees when a plane horizontal to the surface of the substrate 7 is used as a reference. The dimensions of the molding member 8 are not necessarily limited to these numerical values.

As described above, the molding member 8 having the period W1 of the grooves GR1 at unequal intervals is manufactured.

In addition, as in the first embodiment, a molding member 8 having a large surface area can be manufactured by joining the plurality of exposure regions 8a to 8c using the plurality of mask patterns 5a to 5c provided in the photomask 5, as compared to, for example, a case where one mask pattern is provided in the photomask 5. That is, an area of the sawtooth shape can be increased.

In addition, a combination of joining is preferably an odd number of rows×an odd number of columns such as three rows×three columns as in the first embodiment, and is preferably an odd number of rows such as at least three rows. For example, when the plurality of exposure regions 8a are joined, the number of times of exposure processing is preferably an odd number of three or more.

As described above, joined portions have been described as the boundary regions BR. Since the boundary regions BR are boundaries between two exposure regions, a deviation between patterns at a boundary or a deviation in pitch dimension may occur due to the alignment accuracy of the exposure device. That is, in the boundary regions BR of exposure patterns, deviation may occur in patterns of the bottom portions BP1 and the top portions TP1 in the Y direction as shown in FIG. 10, and deviation in pitch dimension may also occur in the X direction.

As described later, a surface shape of the diffraction grating 15 is a shape reverse to a surface shape of a metal film 9, and the surface shape of the metal film 9 is a shape obtained by reversing a surface shape of the molding member 8. Therefore, when the surface shape of the molding member includes deviation between patterns or dimensional deviation, the surface shape of the diffraction grating 15 includes deviation between patterns or dimensional deviation corresponding to the molding member 8. When the diffraction grating 15 is used in a spectroscopic analyzer or the like, a central portion of the diffraction grating 15 is a main region for diffracting light. Therefore, if a central position of the diffraction grating 15 includes the deviation between patterns or the deviation in pitch dimension, the optical properties (such as diffraction efficiency of light) may be degraded.

Therefore, it is desirable that a central position of the molding member 8 does not include the boundaries of the exposure regions. In the first embodiment, for example, when the plurality of exposure regions 8a are joined, the number of times of exposure processing is an odd number, so that the boundary regions BR are not formed in the vicinity of the center of the molding member 8. Therefore, since the vicinity of a center of the diffraction grating 15 does not include deviation between patterns or deviation in pitch dimension, performance of the diffraction grating 15 can be improved.

FIG. 6 shows an example in which the mask patterns 5a to 5c have different lengths in the X direction, whereas boundary regions can be prevented from being formed in the vicinity of the center of the diffraction grating by an odd number of times of exposure in the X direction even if the mask patterns 5a to 5c have the same length in the X direction.

As a modification, mask patterns 5a to 5c having different lengths in the Y direction in FIG. 6 can also be formed on the photomask 5. In this case, even when the number of times of exposure processing in the Y direction is not an odd number, the boundary regions BR can be shifted from the central position of the molding member 8. The mask patterns 5a to 5c can also be formed on separate photomasks to perform exposure processing sequentially.

In a boundary region BR extending in the X direction, as shown in FIGS. 10 and 11, there may be a region in which the resist film is abnormal in thickness and/or shape, such as concave portions CC1 lower than a height of the top portions TP1 or convex portions CV1 higher than a height of the bottom portions BP1. The Concave portions CC1 and convex portions CV1 are portions locally present in the middle of the top portions TP1 and the bottom portions BP1 extending in the Y direction, and serve as an example of portions as a vestige of the deviation between patterns or the deviation in pitch dimension as described above.

<Method for Manufacturing Diffraction Grating 15>

Hereinafter, the diffraction grating 15 and the method for manufacturing the diffraction grating 15 will be described with reference to FIGS. 13 to 17. Here, the molding member 8 shown in FIG. 11 will be described by taking a case when the resist film 6a is a negative type as an example.

<<Step S4>>

First, as shown in FIG. 13, a metal film 9 made of, for example, nickel is formed on a surface of the resist pattern 6b (the molding member 8) by, for example, an electrolytic plating method. A material constituting the metal film 9 is not limited to nickel, and may be any metal material generally used in the electrolytic plating method. The metal film 9 is formed in accordance with the surface shape of the resist pattern 6b to cover the plurality of grooves GR1 including the plurality of top portions TP1 and the plurality of bottom portions BP1.

<<Step S5>>

Next, as shown in FIG. 14, the metal film 9 is peeled off from the molding member 8. The surface shape of the metal film 9 prepared in this manner is a sawtooth shape obtained by reversing the surface shape of the resist pattern 6b. That is, the surface shape of the metal film 9 includes a plurality of grooves GR2 including a plurality of top portions TP2 and a plurality of bottom portions BP2, in which the bottom portions BP2 of the metal film 9 correspond to the top portions TP1 of the resist pattern 6b while the top portions TP2 of the metal film 9 correspond to the bottom portions BP1 of the resist pattern 6b. Therefore, dimensions such as a period of the grooves GR2 and an inclination angle of inclined surfaces constituting the grooves GR2 are the same as dimensions relating to the grooves GR1 illustrated in FIG. 12.

When the concave portions CC1 or the convex portions CV1 are formed in the molding member 8 due to the boundary regions BR as described above, convex portions CV2 or concave portions are formed as reversed shapes thereof in the metal film 9. However, since the convex portions CV2 or the concave portions are not included in a central position of the metal film 9, the optical properties of the diffraction grating 15 can be prevented from being degraded.

<<Step S6>>

Next, as shown in FIG. 15, a convex-surface substrate (substrate) 10 made of, for example, blue plate glass or white plate glass and having a convex surface as a surface shape is prepared. Next, an adhesive layer 11 made of a resin material such as epoxy resin is formed on a surface of the convex-surface substrate 10. Step S6 may be performed before or after steps S1 to S5 described above.

<<Step S7>>

Next, as shown in FIG. 16, the metal film 9 is disposed on the surface of the convex-surface substrate 10 such that a rear surface of the metal film 9 faces the surface of the convex-surface substrate 10. Thereafter, a load is applied to the metal film 9 from a surface side of the metal film 9 in the Z direction, thereby attaching the metal film 9 to the surface of the convex-surface substrate 10 via the adhesive layer 11 in accordance with the surface shape of the convex-surface substrate 10. As a method for applying the load, a pressure application method using air pressure, water pressure, etc. is used to achieve uniform load distribution.

<<Step S8>>

Next, as shown in FIG. 17, a concave-surface substrate (substrate) 12 made of, for example, blue plate glass or white plate glass and having a concave surface as a surface shape is prepared. Then, the resin layer 13 made of the resin material such as the epoxy resin is formed on a surface of the concave-surface substrate 12. Step S8 may be performed before or after steps S1 to S7 described above.

<<Step S9>>

Next, as shown in FIG. 18, the convex-surface substrate 10 and the concave-surface substrate 12 are disposed and the metal film 9 is attached to the resin layer 13 such that a surface of the metal film 9 attached to the convex-surface substrate 10 via the adhesive layer 11 faces a surface of the resin layer 13 formed on the concave-surface substrate 12. Thereafter, the resin layer 13 is cured.

<<Step S10>>

Next, as shown in FIG. 19, the convex-surface substrate 10, the adhesive layer 11, and the metal film 9 are peeled off. The surface shape of the resin layer 13 prepared in this manner is a sawtooth shape obtained by reversing the surface shape of the metal film 9. That is, the surface shape of the resin layer 13 includes a plurality of grooves GR3 including a plurality of top portions TP3 and a plurality of bottom portions BP3, in which the bottom portions BP3 of the resin layer 13 correspond to the top portions TP2 of the metal film 9 while the top portions TP3 of the resin layer 13 correspond to the bottom portions BP2 of the metal film 9. Therefore, dimensions such as a period of the grooves GR3 and an inclination angle of inclined surfaces constituting the grooves GR3 are the same as dimensions of the metal film 9.

<<Step S11>>

Next, as shown in FIG. 20, a reflective film 14 made of, for example, an aluminum or gold thin film in accordance with the surface shape of the resin layer 13 is formed on the surface of the resin layer 13 by, for example, a vapor deposition method. A metal material constituting the reflective film 14 is not limited to aluminum or gold, and any material having a high reflectivity may be used. As a result, the diffraction grating 15 including the concave-surface substrate 12, the resin layer 13 having a sawtooth shape as the surface shape, and the reflective film 14 is obtained.

As described above, the diffraction grating 15 having the period of the grooves GR3 at unequal intervals is manufactured by using the molding member 8 with the period W1 of the grooves GR1 at unequal intervals. In addition, a molding member 8 having a large surface area is manufactured by using the plurality of mask patterns 5a to 5c provided in the photomask 5, and the diffraction grating 15 is manufactured by using the molding member 8, so that the area of the sawtooth shape can be increased. Since the molding member 8 is used in manufacture of the diffraction grating without using a mechanically ruling method or a holographic exposure method, and the photolithographic technique is used in manufacture of the molding member 8, the diffraction grating 15 can be manufactured in a relatively short time. In addition, an increase in manufacturing cost can be prevented.

A relationship between the period of the grooves GR3 of the diffraction grating 15 and the length of the openings OP (the first portion OPa to the third portion OPc) of the photomask 5 is considered as follows. A solid line in a graph shown in FIG. 21 shows the length of the openings OP (the first portion OPa to the third portion OPc) of the photomask 5 according to the first embodiment. A dashed line in FIG. 21 shows a period f(x) of the grooves GR3 of the diffraction grating 15, and the period f(x) is expressed by Formula 2 as follows.

$$f(x) = \frac{1}{\sigma_0 \left(1 + 2b_2 \frac{x}{R} + 3b_3 \frac{x^2}{R^2} + 4b_4 \frac{x^3}{R^3}\right)} \quad \text{[Formula 2]}$$

Here, $\sigma_0$ is the number of grooves (number/mm) in the vicinity of the center of the diffraction grating 15, and R is a radius of curvature. Further, $b_2$, $b_3$, and $b_4$ are coefficients, and are determined such that an aberration at an imaging position of diffracted light is minimized according to a range of a wavelength to be used.

For example, in the diffraction grating 15 having a size of 20 mm×20 mm, a radius of curvature of R=100 mm, and the number of grooves of 600/mm, it is necessary to continuously change the period of the grooves GR2 from a narrow interval to a wide interval within a range of 1.617 μm to 1.714 μm.

The length of the openings OP (from the first portion OPa to the third portion OPc) of the photomask 5 in the X direction is set as a length shown by the approximately stepwise dashed line in FIG. 18 with respect to the period of the grooves GR3 of the diffraction grating 15 calculated by Formula 2.

A case where the magnification of the exposure device 1 is equal has been described here, whereas a desired period of the grooves GR3 can be obtained by designing the length of the openings OP in the X direction according to the magnification during exposure even when the reduction exposure method is used.

<Structure of Spectroscopic Analyzer 20 Using Diffraction Grating 15>

The spectroscopic analyzer 20 will be described below as a usage example of the diffraction grating 15 according to the first embodiment with reference to FIG. 22.

As shown in FIG. 22, the spectroscopic analyzer 20 includes a white light source 21, condenser lenses 22a and 22b, a container 23, a slit 25, and a detector (spectroscope) 26. During analysis, the sample 24 to be analyzed is mounted inside the container 23, and the diffraction grating 15 according to the first embodiment is provided below the slit 25.

Light LI2 from the white light source 21 is condensed by the condenser lens 22a, and is used to irradiate the sample 24 inside the container 23. The light transmitting from the sample 24 is condensed in an opening of the slit 25 by the condenser lens 22b. The light passing through the slit 25 is diffracted and a wavelength of the light is dispersed by the diffraction grating 15 to form a spectrum. The diffraction grating 15 can have imaging positions of multiple wavelengths in the horizontal plane. For example, a photodiode is provided in the horizontal plane on an incident surface of the detector 26, and thus the spectrum is detected by the detector 26. In this manner, high analysis performance can be exhibited in the spectroscopic analyzer 20 by using the diffraction grating 15 with the period of the grooves GR2 at unequal intervals.

Second Embodiment

Hereinafter, the molding member 8 will be described according to the second embodiment with reference to FIGS. 5, 23, and 24. In the following description, differences from the first embodiment will be mainly described. As shown in FIG. 5, steps S21 to S23 are performed instead of steps S1 to S3 in the second embodiment.

<<Step S21>>

Step S21 in the second embodiment is substantially the same as step S1 in the first embodiment except a mask pattern 50a provided in a photomask 50.

In the first embodiment, the plurality of mask patterns 5a to 5c are provided in the photomask 5, while in the second embodiment, the mask pattern 50a is provided in the photomask 50 as shown in FIG. 23. The photomask 5 and the photomask 50 have the same size. In the second embodiment, each opening OP formed in the mask pattern 50a includes a plurality of portions, the number of which is equal to or more than the number of the first portion Opa to the third portion OPc in an X direction.

<<Step S22>>

First, exposure processing is performed on the resist film 6a using the mask pattern 50a as shown in FIG. 24. The resist film 6a is partially exposed in an exposure region 80a by performing exposure processing once. Next, the resist film 6a (stage 4) is moved in a Y direction, and the other exposure regions 80a are sequentially exposed. As in the first embodiment, the number of times of multiple exposure processings is preferably an odd number of three or more in consideration of the boundary regions BR.

In the first embodiment, the exposure processing is performed separately on the exposure regions 8a to 8c in the X direction, while in the second embodiment, the exposure regions 80a, which have a long length in the X direction, are exposed. Therefore, since the number of times of exposure processing in the second embodiment is smaller than that in the first embodiment, it is possible to prevent an increase in the number of manufacturing steps and to prevent an increase in manufacturing cost.

Since the first embodiment is provided with the exposure regions 8a to 8c, which have a length equal to or longer than a length of the photomask 5 in the X direction, the first embodiment is superior to the second embodiment in terms of increasing areas of the molding member 8 and the diffraction grating 15. However, when an increase in area is not required, such as when a diffraction grating having a relatively small area is to be manufactured, the second embodiment is superior to the first embodiment in terms of the manufacturing cost.

<<Step S23>>

Next, as in step S3 of the first embodiment, development processing is performed on the resist film 6a. As a result, the resist pattern 6b shown in FIG. 10 or 11 is formed. After that, post-bake is performed on the resist pattern 6b at, for example, 150° C. to 200° C.

In the first embodiment, since positions of the mask patterns 5a to 5c are adjusted such that the first portion OPa to the third portion OPc communicate with each other, the concern on the boundary regions BR in the X direction is much smaller than that in the Y direction. In the second embodiment, it is not necessary to further consider such concern, so that optical properties of the diffraction grating 15 can be further prevented from being degraded.

Patterns corresponding to 50a in FIG. 23 and having different lengths in the Y direction may be formed on the same mask or a plurality of masks, and may be exposed separately. In this case, even when the number of times of exposure processing in the Y direction is an even number, the boundary regions BR can be prevented from being located near a center of the diffraction grating.

Since subsequent manufacturing steps are the same as steps S4 to S11 in the first embodiment, description thereof will be omitted.

Although the invention made by the inventors of the invention has been described in detail based on the embodiments as described above, the present invention is not limited to the foregoing embodiments, and various modifications can be made without departing from the spirit of the invention.

REFERENCE SIGN LIST 1 exposure device
2 light source 3 projection optical mechanism
4 stage
5 photomask (reticle)
5a to 5c mask pattern
6a resist film
6b resist pattern
7 substrate (semiconductor substrate)
8 molding member
8a to 8c exposure region
9 metal film
10 convex-surface substrate (substrate)
11 adhesive layer
12 concave-surface substrate (substrate)
13 resin layer
14 reflective film
15 diffraction grating (optical element)
20 spectroscopic analyzer
21 white light source
22a, 22b condenser lens
23 container
24 sample
25 slit
26 detector
50 photomask (reticle)
50a to 50c mask pattern
80a exposure region
BP1 to BP3 bottom portion
BR boundary region
CC1 concave portion
CV1, CV2 convex portion
GR1 to GR3 groove
LB light-shielding portion
LI1, LI2 light
OP opening
OPa to OPc first portion to third portion
S1 to S11, S21 to S23 step
TP1 to TP3 top portion

The invention claimed is:

1. A method for manufacturing a diffraction grating comprising:
(a) preparing a molding member including a first substrate and a resist pattern formed on the first substrate and having a surface shape including a plurality of grooves;
(b) forming a first metal film on a surface of the resist pattern to cover the plurality of grooves;
(c) peeling off the first metal film from the molding member to prepare the first metal film having a surface shape reverse to the surface shape of the resist pattern;
(d) preparing a second substrate having a convex surface as a surface shape;
(e) forming an adhesive layer on a surface of the second substrate;
(f) after the steps (a) to (e), disposing the first metal film on the surface of the second substrate such that a rear surface of the first metal film faces the surface of the second substrate;
(g) after the step (f), applying a load to the first metal film from a surface side of the first metal film, thereby attaching the first metal film to the surface of the second substrate via the adhesive layer in accordance with the surface shape of the second substrate;
(h) preparing a third substrate having a concave surface as a surface shape;
(i) forming a resin layer on a surface of the third substrate; and
(j) after the steps (g) to (i), attaching the first metal film to the resin layer such that the surface of the first metal film faces a surface of the resin layer, thereby causing a surface shape of the resin layer to be reverse with respect to the surface shape of the first metal film, wherein
the step (a) includes inserting a photomask, wherein the photomask has a plurality of mask patterns, wherein
a first mask pattern includes a plurality of first openings,
the plurality of first openings each include a first portion and a second portion coupled to and communicating with the first portion in the first direction,
the first portion and the second portion each have a length in the second direction that increases stepwise in a direction from the first portion toward the second portion in the first direction,
the second portion has a length longer than a length of the first portion in the first direction,
the second portion has an opening area larger than an opening area of the first portion,
a second mask pattern having a plurality of second openings formed in the light-shielding film,
the plurality of second openings each include a third portion and a fourth portion coupled to and communicating with the third portion in the first direction,
the third portion and the fourth portion each have a length in the second direction that increases stepwise in a direction from the third portion toward the fourth portion in the first direction,
the third portion has a length longer than the length of the second portion and shorter than a length of the fourth portion in the first direction,
the third portion has an opening area larger than the opening area of the second portion and smaller than an opening area of the fourth portion,
the plurality of grooves include a plurality of first bottom portions and a plurality of first top portions,
the plurality of first bottom portions and the plurality of first top portions are alternately repeated in a first direction when viewed from a top, and each extend in a second direction orthogonal to the first direction, and
the first bottom portions adjacent to each other in the first direction have an interval that changes stepwise.

2. The method for manufacturing a diffraction grating according to claim 1, wherein
the interval between the first bottom portions adjacent to each other in the first direction increases stepwise.

3. The method for manufacturing a diffraction grating according to claim 2, wherein
a distance between one of two first bottom portions adjacent to each other in the first direction and the first top portion located between the two first bottom portions is longer than a distance between the other of the two first bottom portions and the first top portion located between the two first bottom portions.

4. The method for manufacturing a diffraction grating according to claim 1, wherein
the step (a) includes:
(a1) preparing an exposure device including a light source, a stage, and a projection optical mechanism provided between the light source and the stage;
(a2) mounting on the stage a laminated body including the first substrate and a resist film formed on the first substrate;
(a3) inserting a photomask having at least a first mask pattern between the light source and the projection optical mechanism;

(a4) after the steps (a1) to (a3), performing a first exposure processing of irradiating the photomask with light from the light source and transfers light transmitting through the first mask pattern to the resist film via the projection optical mechanism; and (a5) after the step (a4), performing development processing on the resist film, thereby forming the resist pattern.

5. The method for manufacturing a diffraction grating according to claim 4, wherein the step (a4) is performed by an odd number of times of three or more by moving the stage in the second direction, and the resist film has regions exposed by the first exposure processing performed by an odd number of times of three or more that are adjacent to each other in the second direction.

6. The method for manufacturing a diffraction grating according to claim 5, wherein the photomask has a light-shielding film formed with a plurality of first openings, the first plurality of mask pattern includes the plurality of first openings, the plurality of first openings each include a first portion and a second portion coupled to and communicating with the first portion in the first direction.

7. The method for manufacturing a diffraction grating according to claim 6, wherein the step (a4) further includes, before or after the first exposure processing, performing a second exposure processing of irradiating the photomask with light from the light source and transferring light transmitting through the second mask pattern to a region of the resist film other than the regions where the first exposure processing is performed via the projection optical mechanism, and in the step (a4), a position of each of the first mask pattern and the second mask pattern is adjusted such that the second portion and the third portion are coupled to and communicate with each other in the first direction.

8. The method for manufacturing a diffraction grating according to claim 6, wherein a longest distance among lengths of the first portion and the second portion that increase stepwise in the second direction is equal to or less than a resolution limit of the exposure device.

9. The method for manufacturing a diffraction grating according to claim 1, further comprising:

(k) after the step (j), forming a reflective film made of a metal material on the surface of the resin layer.

10. A diffraction grating comprising:

a substrate having a concave surface as a surface shape;

a resin layer formed on a surface of the substrate; and a reflective film formed on a surface of the resin layer in accordance with a surface shape of the resin layer and made of a metal material, wherein the surface shape of the resin layer includes a plurality of grooves including a plurality of first bottom portions and a plurality of first top portions, the plurality of first bottom portions and the plurality of first top portions are alternately repeated in a first direction when viewed from a top, and each extend in a second direction orthogonal to the first direction, the first bottom portions adjacent to each other in the first direction have an interval changing continuously, a boundary region in which a deviation between patterns or a dimensional deviation is locally generated is present in the middle of each of the plurality of first top portions extending in the second direction, and the boundary region is not present at a central position of the resin layer when viewed from a top, wherein a distance between one of two first bottom portions adjacent to each other in the first direction and a first top portion located between the two first bottom portions is longer than a distance between the other of the two first bottom portions and the first top portion located between the two first bottom portions.

11. A photomask comprising:

a light-shielding film formed with a first opening, wherein the first opening includes a first portion and a second portion coupled to and communicating with the first portion in a first direction when viewed from a top, the first portion and the second portion each have a length in a second direction orthogonal to the first direction that increases stepwise in a direction from the first portion toward the second portion in the first direction, the second portion has a length longer than a length of the first portion in the first direction, and the second portion has an opening area larger than an opening area of the first portion, wherein the photomask further comprises a first mask pattern including the plurality of first openings; and a second mask pattern including a plurality of second openings formed in the light-shielding film, wherein the plurality of second openings each include a third portion and a fourth portion coupled to and communicating with the third portion in the first direction, the third portion and the fourth portion each have a length in the second direction that increases stepwise in a direction from the third portion toward the fourth portion in the first direction, the third portion has a length longer than the length of the second portion and shorter than a length of the fourth portion in the first direction, and the third portion has an opening area larger than the opening area of the second portion and smaller than an opening area of the fourth portion.

12. The photomask according to claim 11, wherein the light-shielding film is formed with a plurality of first openings adjacent to each other in the second direction.

13. The photomask according to claim 11, wherein the first portion includes a plurality of first windows each having a quadrangular planar shape, and the plurality of first windows are coupled to and communicate with each other such that the plurality of first windows have opening areas that increase stepwise in the direction from the first portion toward the second portion.

* * * * *